United States Patent
Towle

(10) Patent No.: US 6,770,575 B2
(45) Date of Patent: Aug. 3, 2004

(54) METHOD FOR IMPROVING THERMAL STABILITY OF FLUORINATED AMORPHOUS CARBON LOW DIELECTRIC CONSTANT MATERIALS

(75) Inventor: Steven N. Towle, Menlo Park, CA (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 10/082,997

(22) Filed: Feb. 25, 2002

(65) Prior Publication Data

US 2002/0088707 A1 Jul. 11, 2002

Related U.S. Application Data

(62) Division of application No. 09/108,614, filed on Jul. 1, 1998, now abandoned.

(51) Int. Cl.⁷ .......................... H01L 21/31; C23C 14/34; C23C 16/00
(52) U.S. Cl. ....................... 438/783; 438/778; 438/780; 438/700; 438/702; 438/703; 438/737; 438/738; 438/696; 438/680; 438/430; 427/249.5; 427/97; 204/192.15
(58) Field of Search ........................... 427/249.1, 249.5, 427/249.7, 97, 569; 438/778, 780, 783, 700, 702, 703, 737, 738, 696, 680; 204/192.15, 192.17; 430/430

(56) References Cited

U.S. PATENT DOCUMENTS

| | | | |
|---|---|---|---|
| 4,971,667 A | | 11/1990 | Yamazaki et al. |
| 4,988,573 A | | 1/1991 | Nakayama et al. |
| 5,017,403 A | * | 5/1991 | Pang et al. .................. 427/576 |
| 5,045,355 A | | 9/1991 | Spiro et al. |
| 5,069,967 A | | 12/1991 | Yokoyama et al. |
| 5,698,901 A | * | 12/1997 | Endo ........................... 257/758 |
| 5,750,210 A | | 5/1998 | Schmidt et al. |

OTHER PUBLICATIONS

Annen, A., et al., Erosion of amorphous hydrogenated boron–carbon thin films, Journal of Nuclear Materials 231 (1996) pp. 151–154, ©1996 Elsevier Science, B.V.

Endo, Kazuhiko, et al., Fluorinated amorphous carbon thin films grown by helicon plasma enhanced chemical vapor deposition for low dielectric constant interlayer dielectrics, Appl. Phys. Lett. 68 (20) May 13, 1996, pp. 2864–2866, ©American Insitute of Physics.

Endo, Kazuhiko, et al., Fluorinated amorphous carbon thin films grown by plasma enhanced chemical vapor desposition for low dielectric constant interlayer dielectrics, J. Appl. Phys. 78 (2), Jul. 15, 1995, pp. 1370–1372, ©1995 American Institute of Physics.

Endo, Kazuhiko, et al., Nitrogen doped fluorinated amorphous carbon thin films grown by plasma enhanced chemical vapor deposition for low dielectric constant interlayer dielectrics, Appl. Phys. Lett. 68 (25), Jun. 17, 1996, pp. 3656–3658 ©American Institute of Physics.

(List continued on next page.)

*Primary Examiner*—Rodney G. McDonald
(74) *Attorney, Agent, or Firm*—Blakely, Sokoloff, Taylor & Zafman LLP

(57) ABSTRACT

A process for forming a thermally stable low-dielectric constant material is provided. A gas mixture is prepared to form a fluorinated amorphous carbon (a-C:F) material. The gas mixture is mixed with a boron-containing gas.

7 Claims, 10 Drawing Sheets

OTHER PUBLICATIONS

Matsubara, Y., et al., Low–k Fluorinated Amporphous Carbon Interlayer Technology for Quarter Micron Devices, ULSI Device Development Labs, *Microelectronic Res. Labs., **VLSI Manufacturing Engineering Division, NEC Corporation, 1120 Shimokuzawa, Sagamihara, Kanagawa, 229, Japan, 4 pages, No Date.

Sharapov, V.M., et al., Erosion of a–B/C : H films under deuterium plasma irradiation, Journal of Nuclear Materials 220–222 (1995) 930–933, pp. 930–933, ©1995 Elsevier Science B.V.

Yamaki, T., et al., Thermal desorption spectroscopy of boron/carbon films after keV deuterium irradiation, Journal of Nuclear Materials 217 (1994) 154–160, pp. 151–160, ©1994 Elsevier Science B.V.

Sah, R.E., Mass Spectrometric Study Of Gas Evolution From Plasma–Deposited Fluorohydrogenated Amorphous Carbon Films On Heating, Thin Solid Films, International Journal on the Science and Technology of Thin and Thick Films, 167, Dec. $15^{th}$, 1988, pp. 255–260, © Elsevier Sequoia/Printed in The Netherlands.

Winter, J., A comparison of tokamak operation with metallic getters (Ti, Cr, Be) and boronization, Journal of Nuclear Meterials, vols. 176 & 177, Dec. 1990, pp. 14–31, © Elsevier Science Publishers B.V. (North Holland).

* cited by examiner

METHOD FOR IMPROVING THERMAL STABILITY OF FLUORINATED AMORPHOUS CARBON LOW DIELECTRIC CONSTANT MATERIALS

This is a Divisional application of Ser. No.: 09/108,614 filed Jul. 1, 1998 now abandoned, which is presently pending.

BACKGROUND OF THE INVENTION

1. Field of the Invention

The present invention relates to the field of fabrication of integrated circuits. More specifically, the present invention relates to a process for improving the thermal stability of low dielectric constant materials included in integrated circuits.

2. Description of the Related Art

Modern integrated circuits are generally made up of millions of fit active and passive devices such as transistors, capacitors, and resistors disposed in a silicon wafer. These devices are initially isolated from one another, but are later interconnected together by an interconnect system to form functional circuits. The quality of the interconnection of these devices drastically affects the performance and reliability of the fabricated integrated circuit.

An interconnect system typically includes metal lines, spaced apart from each other. The metal lines interconnect the various active and passive devices found in a silicon wafer onto which an interconnect system is deposited and fabricated. The metal lines are separated by insulating dielectric material for isolating the metal lines from one another. Inherent in the structure of the interconnect system is a capacitance associated with the metal lines spaced apart from each other. Decreasing this capacitance is desirable as several advantages can be achieved therefrom, such as reduced RC delay, reduced power dissipation, and reduced cross-talk between the metal lines. The capacitance is inversely proportional with the distance between the metal lines. Thus, one way to reduce the capacitance between the metal lines would be to increase the space between the lines. However, this option is not desirable because of the limitations imposed by packing density.

Another way to reduce the capacitance between the lines of an interconnect system is to reduce the dielectric constant (k) of the dielectric material deposited between the metal lines. The capacitance of the metal lines is directly proportional to the dielectric constant of the dielectric material between the metal lines. The dielectric constant of a material is generally defined as the material's ability to maintain a difference in electrical charge over a specified distance.

One dielectric material typically used to isolate metal lines from each other is silicon dioxide ($SiO_2$). $SiO_2$ is a thermally and chemically stable material. The dielectric constant of $SiO_2$ is approximately 4. The dielectric constant is based on a scale where 1.0 represents the dielectric constant of a vacuum. Various materials exhibit dielectric constants from approximately 1.0 to values in the hundreds.

The dielectric constant of $SiO_2$ is considered high. Recent attempts have been made to use low dielectric-constant materials such as organic and inorganic polymers that have densities and dielectric constants lower than those of $SiO_2$ to replace $SiO_2$ as a dielectric material thereby reducing the capacitance between the metal lines.

One such low dielectric constant material is fluorinated amorphous carbon (a-C:F) that has a dielectric constant of about 2.3 (±0.4) and low thermal stability. This thermal stability is lower than the thermal stability of previously used oxides such as $SiO_2$. Low thermal stability causes problems in integrated circuit fabrication, as during the process of fabrication of integrated circuits and their interconnect structures, temperatures in excess of 400° C. are often reached. As processing temperatures climb, a-C:F materials heat up and decompose into highly corrosive fluorine species such as F, CF, $CF_2$, and $CF_3$. When these fluorine species outgas or outdiffuse into the surrounding metal layers, they tend to cause corrosion of the metal layers of the interconnect and create potential adhesion problems with juxtaposed dielectric films. These films may ultimately cause yield and reliability problems in the devices being fabricated.

It is desirable to provide a thermally stable a-C:F material and a method to improve the thermal stability by decreasing fluorine its outdiffusion from a-C:F during high temperature processing.

SUMMARY OF THE INVENTION

The present invention provides a process for forming a thermally stable low dielectric constant material. A gas mixture is prepared to form a fluorinated amorphous carbon (a-C:F) material. The gas mixture is mixed with a boron-containing gas.

BRIEF DESCRIPTION OF THE DRAWINGS

The features, aspects, and advantages of the present invention will become more fully apparent from the following detailed description, appended claims, and accompanying drawings in which:

DETAILED DESCRIPTION OF THE INVENTION

In the following description, numerous specific details are set forth to provide a thorough understanding of the present invention. It should be obvious, however, to one skilled in the art that these specific details need not be employed to practice the present invention. In other instances, well-known materials or methods have not been described in detail in order to avoid unnecessarily obscuring the present invention.

The present invention provides a process of adding boron to low dielectric constant materials including fluorinated amorphous carbon (a-C:F). The combination of a-C:F materials with boron is more a thermally stable than prior art a-C:F materials and therefore may be used in the process of integrated circuit fabrication at processing temperatures within a wider range without the production of dangerous radicals or corrosive outdiffusion.

Figure 1:
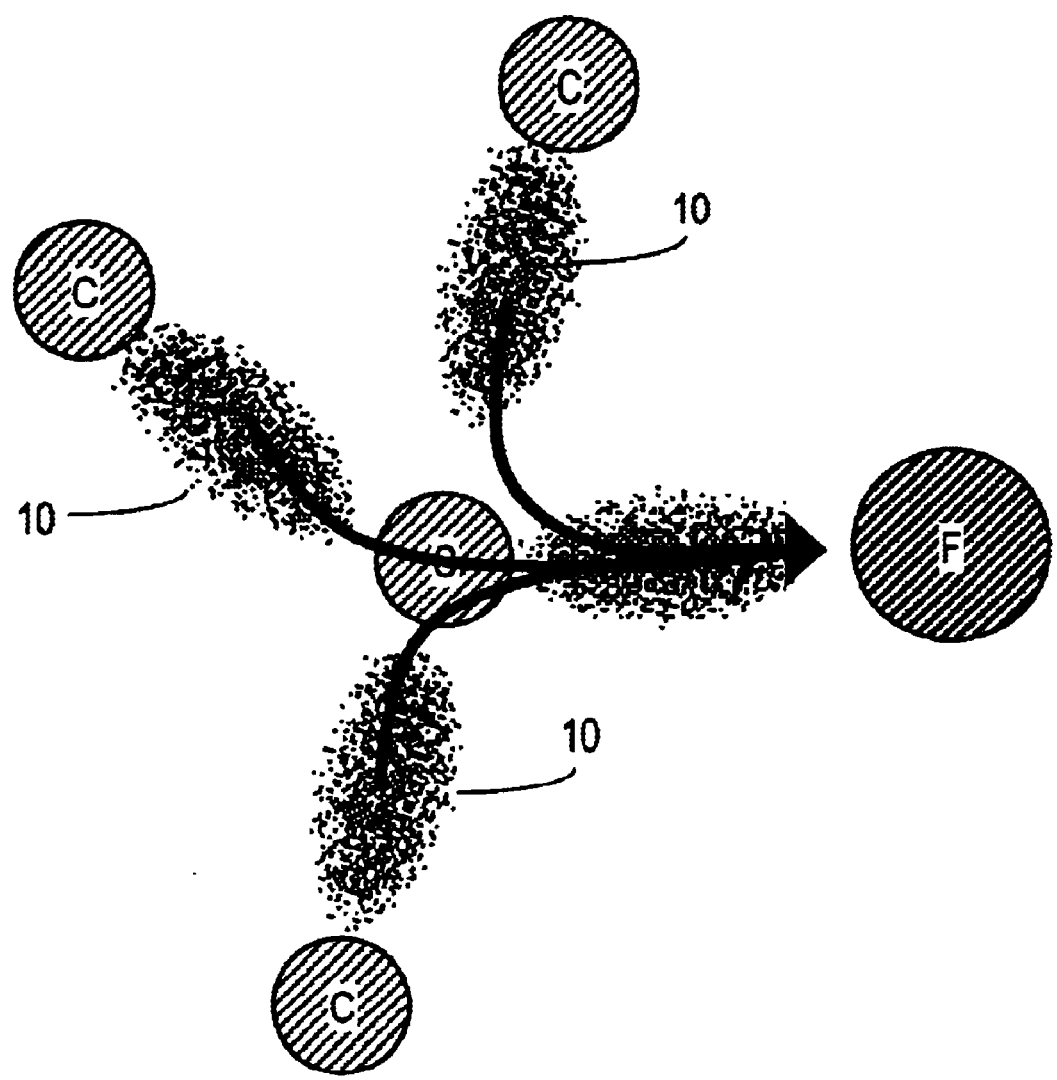
FIG. 1 illustrates atomic interaction among carbon and fluorine atoms in an a-C:F material.

FIG. 1 illustrates an example of a local region of an a-C:F material having an atomic structure of four carbon (C) atoms and one fluorine (F) atom. FIG. 1 shows the bonding of the a-C:F material with the electron cloud 10 comprising C—C and C—F bonds. Since fluorine (F) is the most electronegative element, fluorine atoms easily enter into combinations with most other chemical elements, such as carbon. Electronegative fluorine atoms attract electron cloud 10 from the surrounding C—C bonds into the C—F bond decreasing the density of electron cloud 10 in the C—C bonds and increasing the density of the electron cloud in the C—F bond. As a result, the polymer as a whole becomes less polarizable. Less polarizable polymers have low dielectric constants, while more polarizable polymers have high dielectric constants.

Figure 2:
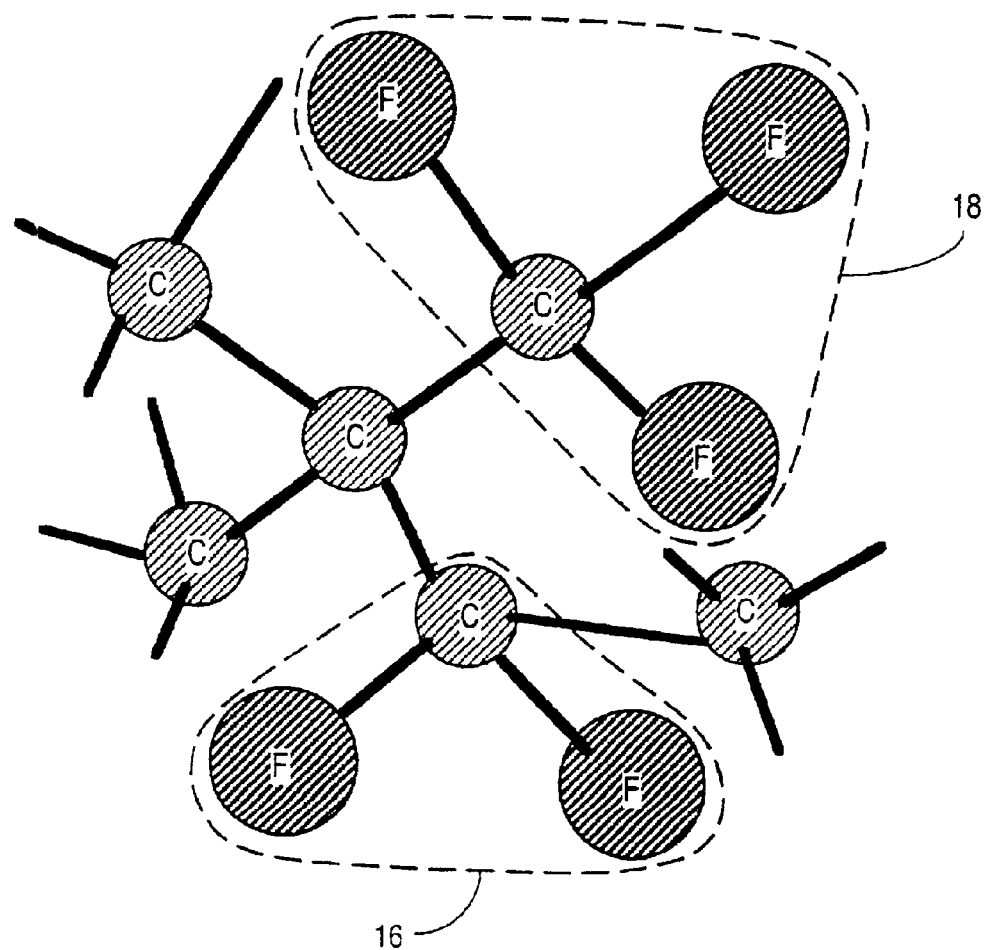
FIG. 2 illustrates the molecular structure of a-C:F material.

FIG. 2 shows the molecular structure 200 of a fluorinated amorphous carbon (a-C:F) material. $CF_2$ 16 (shown in dotted lines) and $CF_3$ 18 (shown in dotted lines) groups are cross-linked to a network of carbon (C) atoms. The presence of a range of molecular structures in the same material (a-C:F), such as $CF_2$ 16 and $CF_3$ 18 groups, leads to poor thermal stability. As discussed above, a principal shortcoming of a-C:F materials in their use as low constant dielectrics, is that at integrated circuit processing temperatures, a-C:F materials degrade into highly corrosive F, CF, $CF_2$, and $CF_3$ species that outgas and chemically attack metal structures in the interconnect. One reason that various fluorinated species outgas at higher processing temperatures is that fluorinated amorphous carbon materials have large quantities of fluorine in them. Amorphous carbon materials with higher fluorine content tend to break down at higher temperatures.

One way to improve the thermal stability and reduce the outgassing of fluorinated species is changing the structure of a-C:F materials. The present invention accomplishes this by incorporating boron into the a-C:F film so that it forms part of the amorphous carbon matrix and binds fluorine atoms. The addition of boron (B) causes improvement of the thermal stability by reducing fluorine outdiffusion from fluorinated amorphous carbon (a-C:F) materials. Unlike other dopants such as nitrogen, boron can have a negligible effect on the dielectric constant of a-C:F. Boron atoms have few electrons (atomic number 5) that contribute to polarizability, and forms strong covalent bonds with carbon, which have relatively low electric polarizability. Further, because boron forms mainly covalent bonds with fluorine atoms, the dielectric constant of the new material including boron is not significantly increased through formation of electric dipoles or mobile ions.

Figure 3:
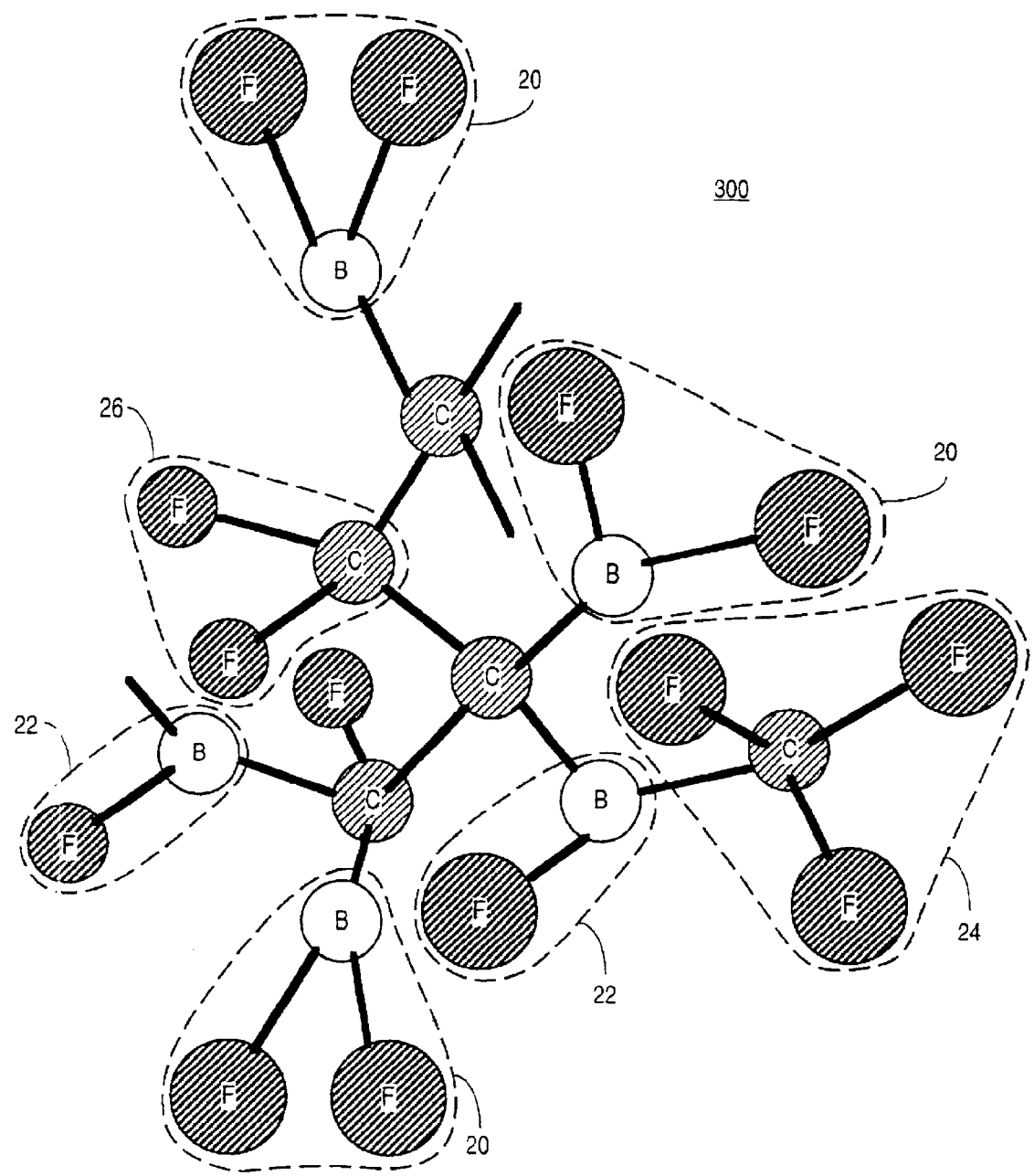
FIG. 3 illustrates the molecular structure of boron doped fluorinated amorphous carbon (a-C:B:F) material, in accordance with one embodiment of the present invention.

FIG. 3 shows the molecular structure 300 of a boron doped fluorinated amorphous carbon (a-C:B:F) material in accordance with one embodiment of the present invention. As B—F bonds are stronger than C—F bonds, BF 22 and $BF_2$ 20 groups are expected to bond F more tightly than $CF_3$ 24 and $CF_2$ 26 groups leading to higher thermal stability. The addition of boron to a-C:F material causes the thermal stability of a-C:F to improve as strong C—B and B—F bonds are formed and the concentration of weakly bound fluorine species, such as $CF_2$ 26 and $CF_3$ 24 is reduced.

An a-C:B:F material produced by the embodiment of the process of the present invention described herein is estimated to be thermally did stable at temperatures of around 450° C. at which, for the most part, a-C:F materials would not be thermally stable. Further, by adding boron to a-C:F materials, the outgassing of F-rich species (e.g., $CF_2$, $CF_3$) is lowered as boron and fluorine form stronger bonds than carbon and fluorine. Strongly bound chemical structures increase the thermal stability as opposed to weakly bound chemical structures that decrease the thermal stability.

Figure 4:
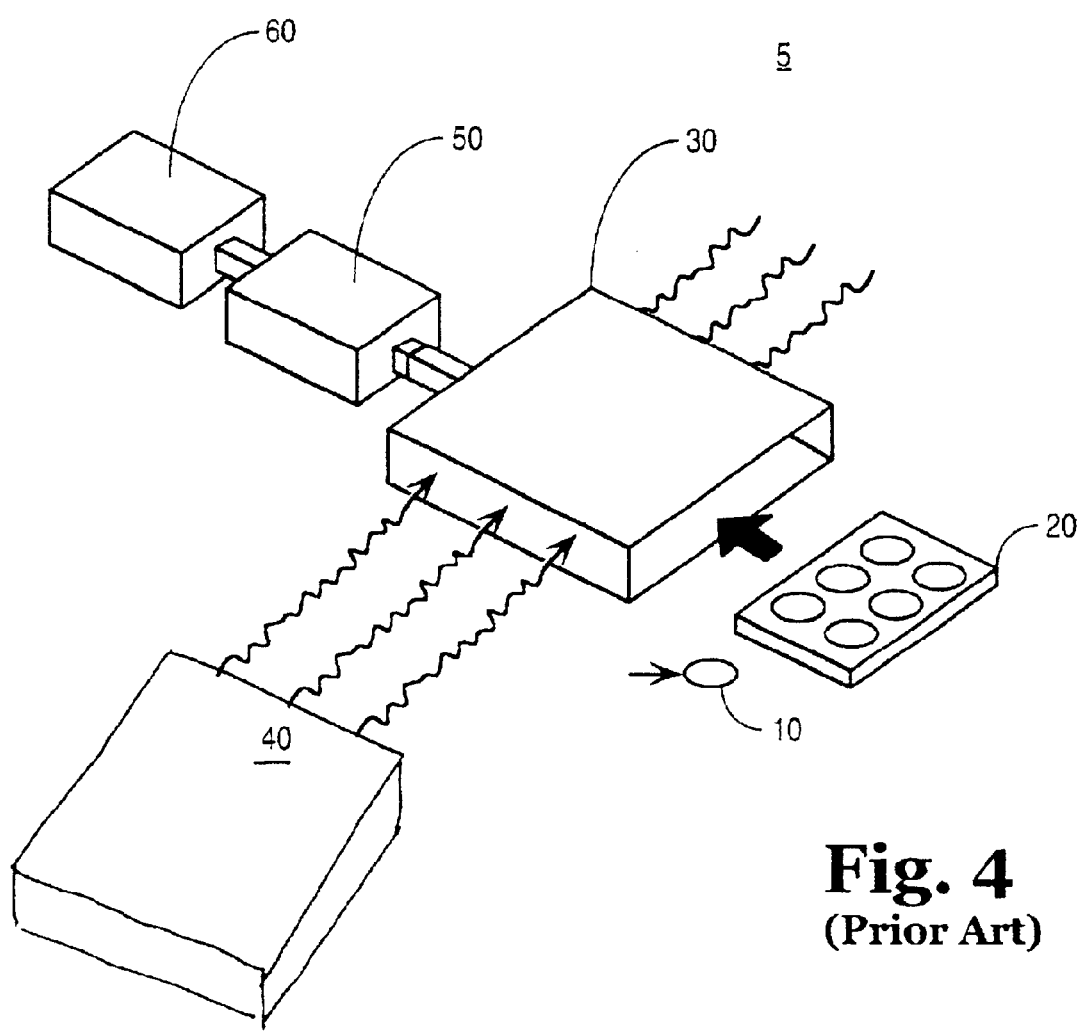
FIG. 4 illustrates a conventional chemical vapor deposition (CVD) system where a-C:F film may be formed on a wafer.

A thin film of a-C:F may be formed on a wafer in a reaction chamber by conventional chemical vapor deposition (CVD), plasma-enhanced CVD, or by reactive sputtering processes. FIG. 4 illustrates a conventional CVD system where a-C:F film may be formed on a wafer. The CVD system 5 includes a wafer holder 20, a reaction chamber 30, energy source 40 producing energy to the reaction chamber 30, a flow control and timer section 50 and a chemical source 60. The wafer 10 is placed in wafer holder 20 and loaded into reaction chamber 30 usually containing an inert gas. Chemicals are housed in chemical source 60. Chemical vapors are generated from pressurized gas cylinders or liquid source bubblers (not shown). Flow control and timer section 50 maintain the gas flow by pressure regulators (not shown), mass flow meters (not shown), and timers (not shown). Chemical vapors are introduced for so long as required to deposit the film. At the end of the process, the chemical source vapors are flushed out and wafer 10 is removed.

Figure 5:
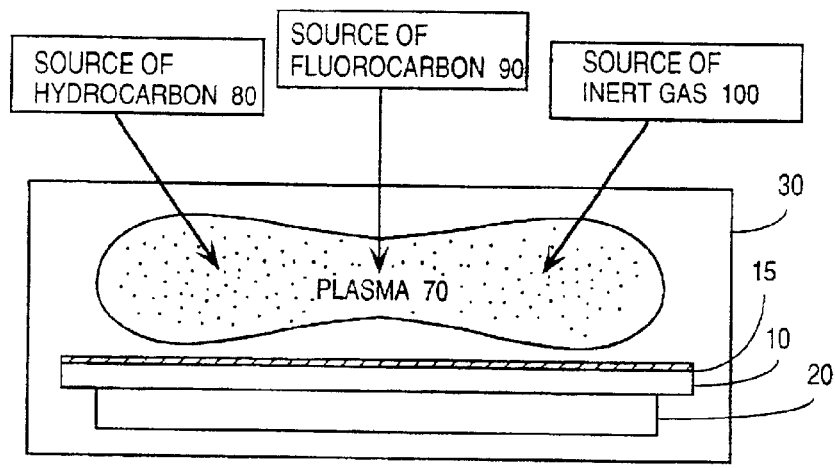
FIG. 5 illustrates a cross-sectional view of a chemical reaction chamber showing a thin layer of a-C:F formed on a wafer by way of a CVD process.

FIG. 5 illustrates a cross-sectional view of a chemical reaction chamber showing a thin layer of a-C:F formed on a wafer by way of a CVD process. Wafer 10 is placed on wafer holder 20 and loaded into reaction chamber 30. The chemicals containing the carbon and fluorine atoms or molecules required in an a-C:F layer, such as the hydrocarbon gas and fluorocarbon gas, originate from a chemical source (not shown) of hydrocarbon 80 and a chemical source of fluorocarbon 90. Hydrocarbon gas may include methane ($CH_4$) and fluorocarbon gas may include octafluorobutane ($C_4F_8$). Hydrocarbon and fluorocarbon flow through flow control and timer section (not shown) and enter reaction chamber 30 to form a plasma 70. An inert gas, such as argon (Ar), that originates from a chemical source of inert gas 100 may also be introduced into plasma 70 to help stabilize plasma 70. The carbon and fluorine atoms or molecules, from hydrocarbon and fluorocarbon, respectively, deposit on the surface of wafer 10 and build up to form an a-C:F layer 15. Generally, CVD reactions require applying energy to the system, such as the plasma 70 shown or heating the chamber or the wafer.

A thin film of a-C:B:F, suitable for application as a barrier layer, hardmask, or anti-reflective coating (ARC) may be formed by treating the a-C:F layer with a boron-containing plasma in a CVD process.

Figure 6:
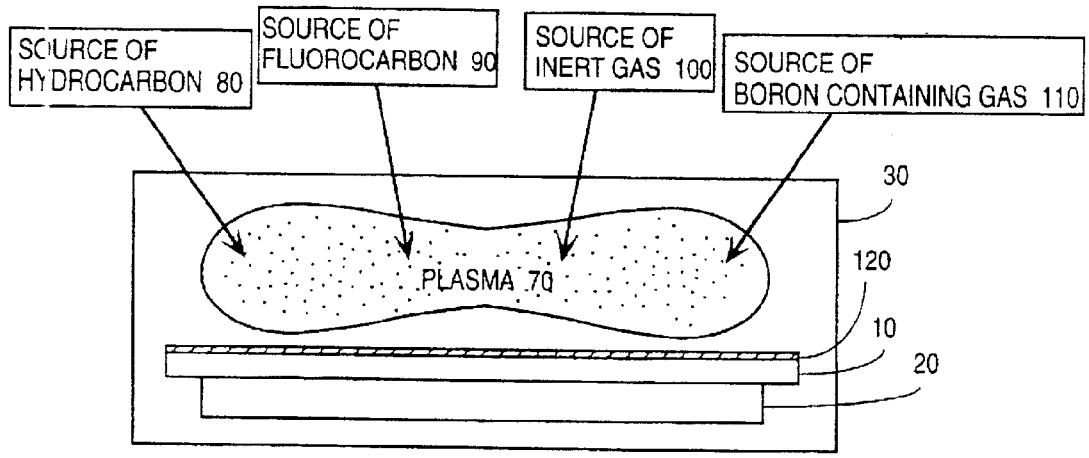
FIG. 6 illustrates a cross-sectional view of a chemical reaction chamber showing a thin layer of a-C:B:F formed on a wafer by way of a CVD process, according to one embodiment of the present invention.

FIG. 6 illustrates a cross-sectional view of a chemical reaction chamber showing a thin layer of a-C:B:F formed on a wafer by way of a CVD process, according to one embodiment of the present invention. Alternatively, a-C:B:F layer may also be formed by way of reactive sputtering. In forming a thin layer of a-C:B:F 120 on wafer 10, a boron-containing gas is mixed into reaction chamber 30 with the chemicals needed, such as hydrocarbon, fluorocarbon, and an inert gas for forming a thin layer of a-C:F on wafer 10. The boron-containing gas may include diborane ($B_2H_6$) or boron trifluoride ($BF_3$). The thin layer of a-C:B:F 120 formed on wafer 10 may have a thickness no greater than a few hundred angstroms.

The composition of carbon, boron, and fluorine in a-C:B:F material is determined by the desirability for high thermal stability and low dielectric constant. The optional ratio may be separately determined and may be controlled by varying the ratios of the gas flows into the reaction chamber by controlling flow control and timer section. The composition of carbon may range from 30–70%, boron 5–30%, and the residue is fluorine. In one embodiment of the present invention a suitable a-C:B:F material contains a composition of 45% carbon, 15% boron, and 40% fluorine by atomic composition.

FIG. 6 illustrates an a-C:B:F layer formed by CVD techniques or reactive sputtering. An a-C:B:F layer may also be formed by CVD processes after an a-C:F material is formed on a wafer by CVD processes. Alternatively, an a-C:B:F layer may also be formed by reactive sputtering techniques after an a-C:F material is formed on a wafer by reactive sputtering techniques.

Figure 7:
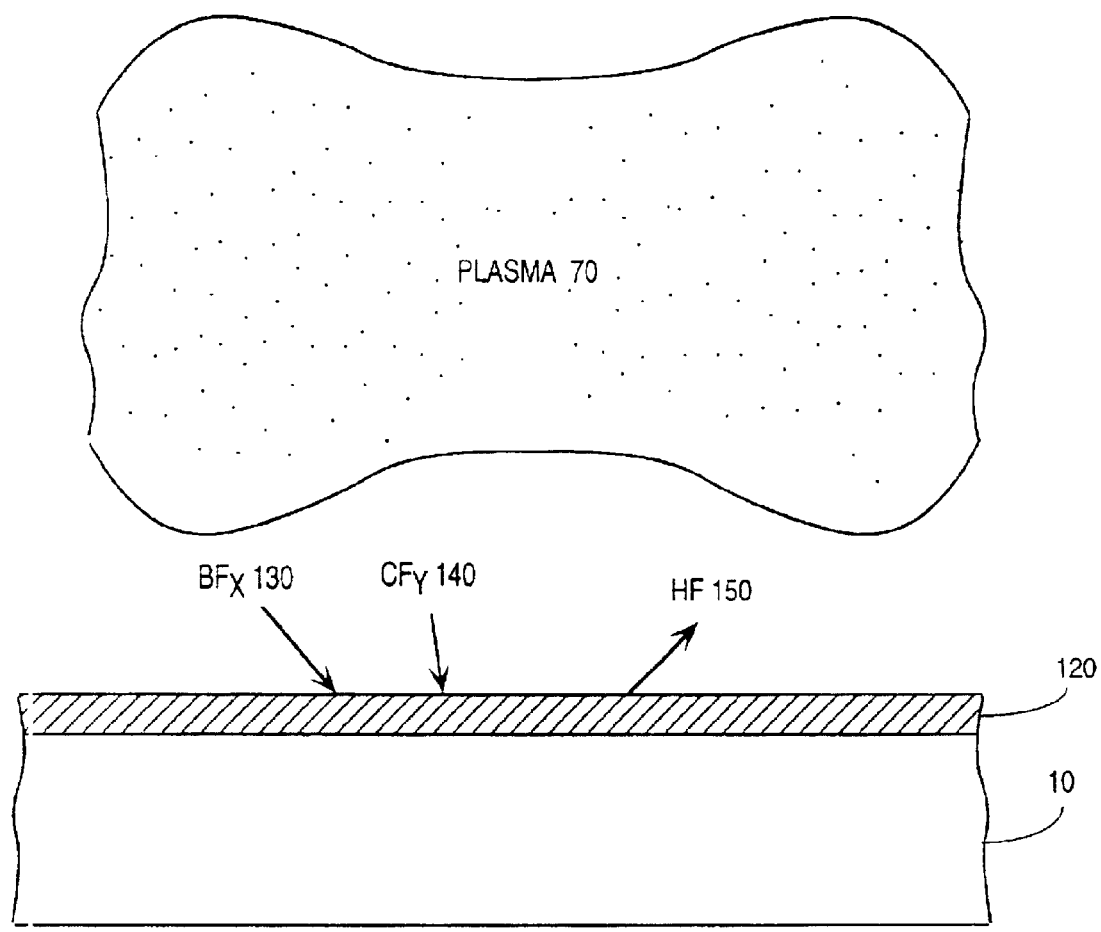
FIG. 7 illustrates a blown-up view of the cross-sectional view of the chemical reaction chamber of FIG. 6 showing a thin layer of a-C:B:F formed on the wafer.

FIG. 7 illustrates a blown-up view of the cross-sectional view of the chemical reaction chamber of FIG. 6 showing a thin layer of a-C:B:F formed on the wafer. FIG. 7 illustrates the chemical reactions taking place at the growing a-C:B:F surface. Species that contribute to net film growth, such as $CF_Y$ 140 and $BF_X$ 130 are formed in the plasma 70 and react to form part of the growing layer 120 when they impinge upon the surface of the growing layer 120. At the same time, species such as H can react with the surface to form volatile species, such as HF, which are then pumped out of the chamber 30. The competition among these various reactions controls the structure and stoichiometry of the layer 120.

Figure 8:
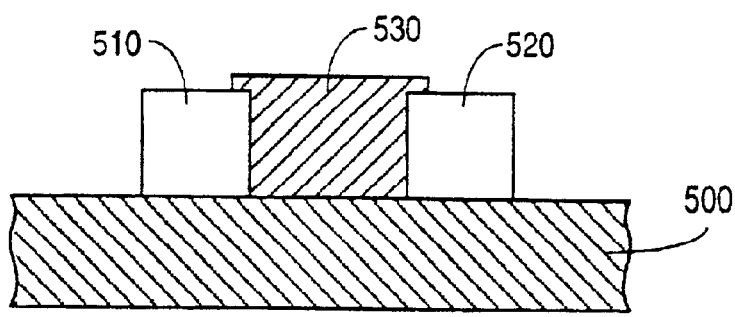
FIG. 8 illustrates an implementation of an a-C:B:F material as a low-k dielectric material for providing an interconnect structure with low capacitance according to one embodiment of the present invention.

FIG. 8 illustrates an implementation of an a-C:B:F material as a low-k dielectric material for providing an interconnect structure with low capacitance according to one embodiment of the present invention. A metal layer is formed upon a substrate 500. Metal deposition techniques are well-known in the art and are therefore not discussed in detail herein. The metal layer is then patterned, using well-known pattering techniques, into metal lines 510 and 520. To decrease the capacitance associated between metal lines 510 and 520, a-C:B:F material 530 is deposited between these metal lines by conventional chemical vapor deposition techniques.

Figure 9:
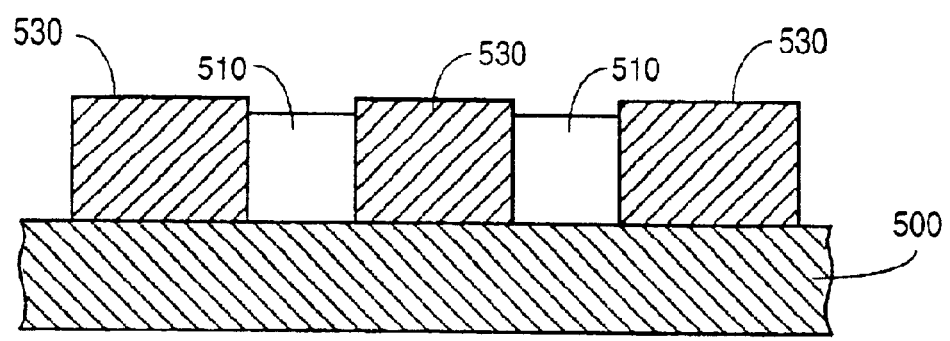
FIG. 9 illustrates an implementation of an a-C:B:F material as a low-k dielectric material for providing an interconnect structure with low capacitance according to a second embodiment of the present invention.

FIG. 9 illustrates an implementation of an a-C:B:F material as a low-k dielectric material for providing an interconnect structure with low capacitance according to a second embodiment of the present invention. FIG. 9 shows that the a-C:B:F material of the present invention may also be used in a damascene process for forming metal interconnect lines. a-C:B:F material 530 is deposited according to the present invention, upon a substrate 500. a-C:B:F material 530 is patterned and etched to form trenches using well-known processing techniques. Metal 510 is then deposited in the trenches of the a-C:B:F material 530.

FIGS. 8 and 9 illustrate just a couple of implementations of the present invention in which an a-C:B:F material may be used for decreasing the capacitance between the metal lines. It is to be understood that there are many methods and many other interconnect structures where it is desirable to use the a-C:B:F material of the present invention to decrease capacitance in integrated circuit fabrication.

Figure 10:
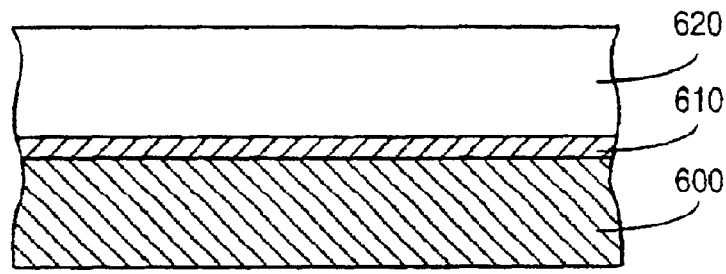
FIG. 10 illustrates an implementation of an a-C:B:F material utilized in an interconnect structure for reducing fluorine outdiffusion according to a third embodiment of the present invention.
Figure 11:
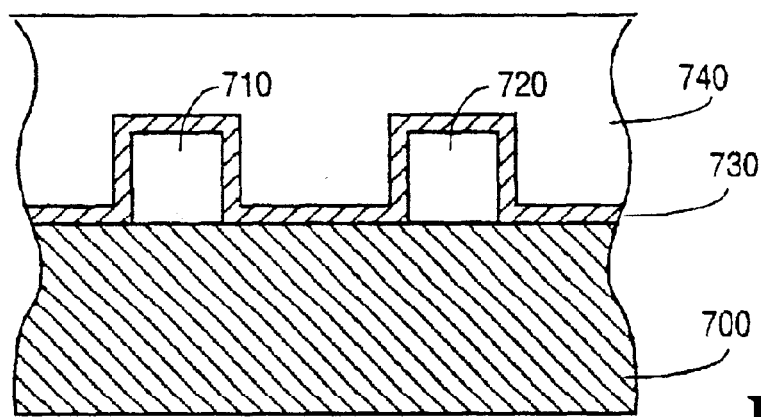
FIG. 11 illustrates an implementation of an a-C:B:F material utilized in an interconnect structure for reducing fluorine outdiffusion according to a fourth embodiment of the present invention.
Figure 12:
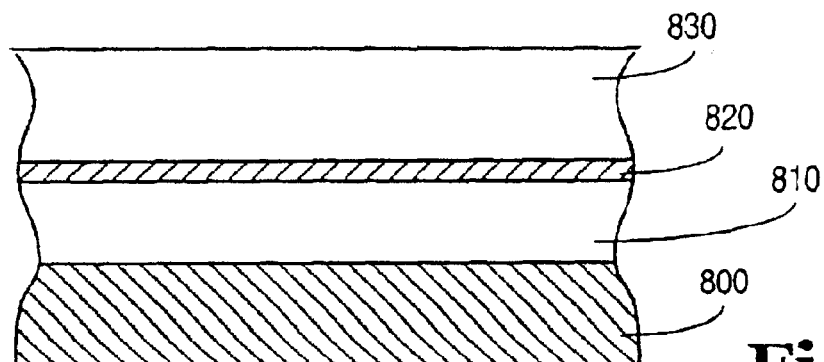
FIG. 12 illustrates an implementation of an a-C:B:F material utilized in an interconnect structure for reducing fluorine outdiffusion according to a fifth embodiment of the present invention.

FIGS. 10–12 illustrate implementations of the present invention in which a barrier layer made of a-C:B:F material may be used to reduce outdiffusion in integrated circuit fabrication.

FIG. 10 illustrates an implementation of an a-C:B:F material utilized in an interconnect structure for reducing fluorine outdiffusion according to a third embodiment of the present invention. An a-C:B:F barrier layer 610 is deposited upon a low-k material 600. Low-k material 600 is used as an interlayer dielectric (ILD) to insulate (or isolate) future processing layers from the underlying layers of a substrate (not shown). A metal layer 620 is deposited upon low-k material 600. When processing temperatures increase, a-C:B:F barrier layer 610 acts as a barrier against fluorine diffusion from low-k material 600 and thereby decreases the potential for corrosion of metal layer 620.

FIG. 11 illustrates an implementation of an a-C:B:F material utilized in an interconnect structure for reducing fluorine outdiffusion according to a fourth embodiment of the present invention. A metal layer is deposited upon substrate 700. The metal layer is then patterned, using well-known pattering techniques, into metal lines 710 and 720. An a-C:B:F barrier layer 730 is conformally deposited upon metal lines 710 and 720 so as to protect metal lines 710 and 720 from fluorine outdiffusion from a low-k material 740 to be deposited thereon.

FIG. 12 illustrates an implementation of an a-C:B:F material utilized in an interconnect structure for reducing fluorine outdiffusion according to a fifth embodiment of the present invention. A low-k material 810 is deposited upon a substrate 800. An a-C:B:F barrier layer 820 is deposited upon low-k material 810. A metal layer 830 is then deposited upon a-C:B:F barrier layer 820. a-C:B:F barrier layer 820 protects metal layer 830 from fluorine outdiffusion from low-k material 810.

FIGS. 10–12 illustrate just a few implementations in which the a-C:B:F barrier layer of the present invention may be used in integrated circuit fabrication. It is to be understood that there are many methods and many other interconnect structures where it is desirable to use a-C:B:F barrier layer of the present invention to decrease fluorine outdiffusion in integrated circuit fabrication. A particular manufacturer may place a-C:B:F barrier layers in areas where it is of particular importance to protect the metal layers from fluorine outdiffusion.

It should be noted that an a-C:B:F material of the present invention may also be used as a hardmask to protect the interlayer dielectric (ILD) during etching and patterning of processing layers above the ILD. The present invention may also be used as a hardmask for patterning carbon-based dielectric materials with hydrogen-based reactive ion etching, for example.

Figure 13:
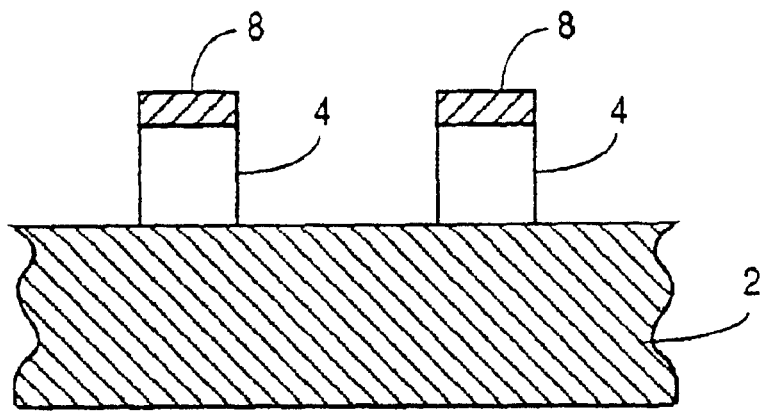
FIG. 13 illustrates the use of an a-C:B:F material as a hardmask for patterning an underlying material, according to a sixth embodiment of the method of the present invention.

FIG. 13 illustrates the use of an a-C:B:F material as a hardmask for patterning an underlying material, according to a sixth embodiment of the present invention. An underlying material, such as a low-k polymer, is deposited upon a substrate 2. An a-C:B:F material is deposited upon the underlying material and patterned by techniques well-known in the art to define an a-C:B:F pattern 8. A portion 4 of the underlying material is then patterned with the a-C:B:F pattern 8. The underlying material may be patterned by conventional hydrogen-based reactive ion etching, for example.

Figure 14:
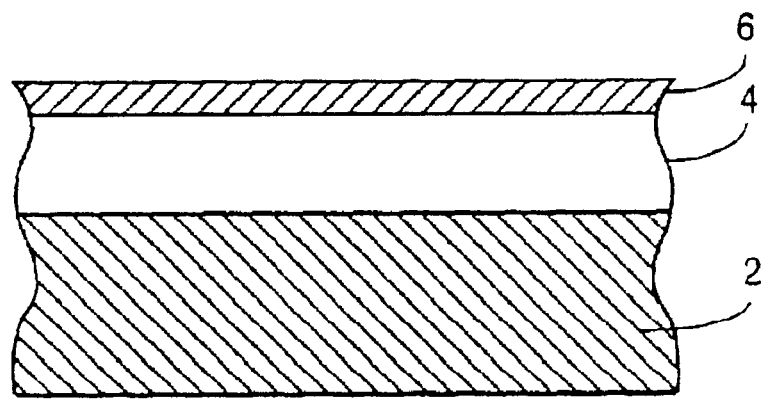
FIG. 14 illustrates the use of an a-C:B:F material as an anti-reflective coating (ARC) for creating a pattern on an underlying material, according to a seventh embodiment of the method of the present invention; and, FIG. 15 illustrates a flow chart diagram with the steps of a method for forming a thermally stable low-dielectric constant material according to one embodiment of the process of the present invention.

In the area of photolithography, the present invention may be used as an antireflective coating (ARC). An ARC aids the patterning of small images by cutting down on light scattering from, for example, a wafer surface into a resist. Since a-C:B:F materials act as an effective etch barrier and they absorb light, the need for an additional layer of ARC may be eliminated because an embodiment of the present invention may be used in place thereof. FIG. 14 illustrates the use of an a-C:B:F material as an anti-reflective coating (ARC), for creating a pattern on an underlying material according to a seventh embodiment of the present invention. An a-C:B:F material 6 is deposited upon an underlying material 4 on a substrate 2. A patterned photoresist layer (not shown) is then formed on the a-C:B:F material 6. The materials 4 and 6 may then be patterned according to the patterned photoresist layer by conventional patterning techniques.

Finally, the present invention may be used in other integration schemes where it is desired to use materials having characteristics of low dielectric constant and high thermal stability.

Figure 15:
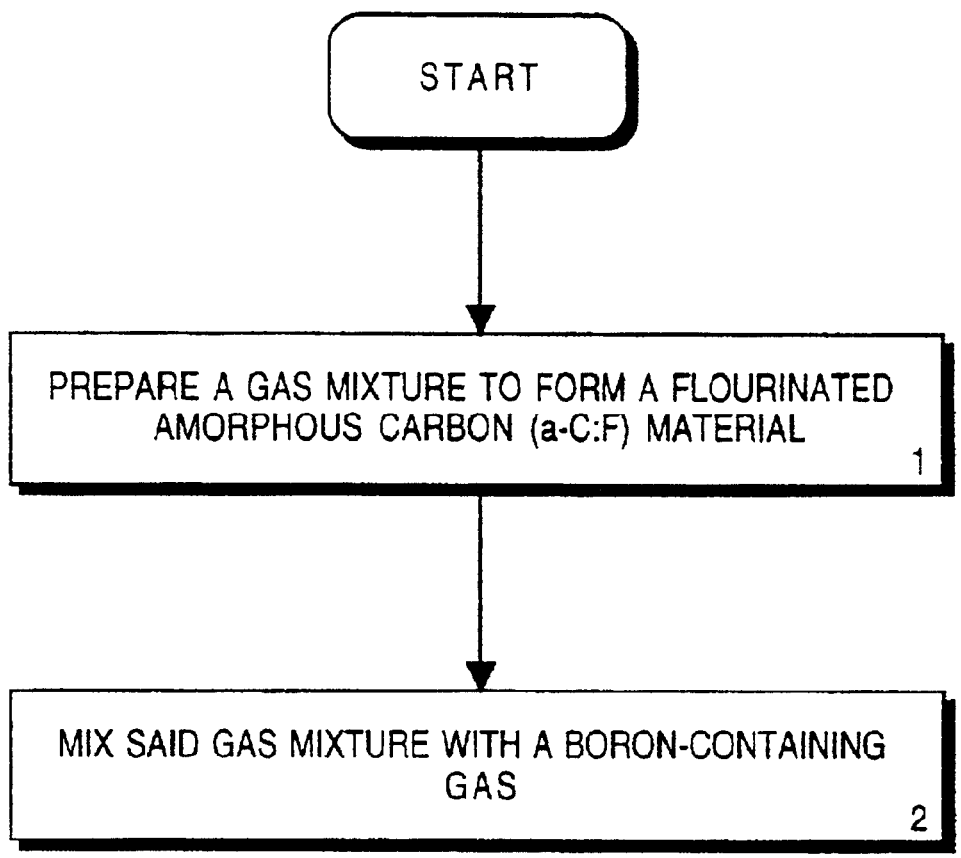

FIG. 15 illustrates a flow chart diagram with the steps of a method for forming a thermally stable low-dielectric constant material according to an embodiment of the process of the present invention. At step 1, a gas mixtures is prepared to form a fluorinated amorphous carbon (a-C:F) material. At Step 2, the gas mixture is mixed with a boron-containing gas to form a boron-doped-fluorinated amorphous carbon (a-C:B:F) material.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A process comprising:

forming a low-k material upon a substrate; and forming an a-C:B:F material over said low-k material;

patterning said a-C:B:F material to form a hard mask; and patterning said low-k material with said hard mask.

2. The process of claim 1, wherein said a-C:B:F material is formed by the process comprising:

preparing a gas mixture to form a fluorinated amorphous carbon (a-C:F) material; and mixing said gas mixture with a boron-containing gas.

3. The process of claim 1 wherein said a-C:B:F material is formed by chemical vapor deposition techniques.

4. The process of claim 1, wherein said a-C:B:F material has an atomic composition of 45% carbon, 40% fluorine, and 15% boron.

5. A process for providing an interconnect structure with the process comprising:

forming a metal layer upon a substrate;

patterning said metal layer;

forming an a-C:B:F barrier layer onto said metal layer; and, forming a low-k material onto said a-C:B:F barrier layer.

6. The process as described in claim 5 wherein said a-C:B:F barrier layer is deposited by way of chemical vapor deposition techniques.

7. A process comprising:

forming a low-k material upon a substrate;

forming an a-C:B:F barrier layer onto said low-K material; and, forming a metal layer onto said a-C:B:F barrier layer.

* * * * *

UNITED STATES PATENT AND TRADEMARK OFFICE
CERTIFICATE OF CORRECTION

PATENT NO.   : 6,770,575 B2
DATED        : August 3, 2004
INVENTOR(S)  : Towle

It is certified that error appears in the above-identified patent and that said Letters Patent is hereby corrected as shown below:

Column 1,
Line 19, delete "fit".

Column 4,
Line 33, delete "did".

Signed and Sealed this

Twelfth Day of July, 2005

JON W. DUDAS
*Director of the United States Patent and Trademark Office*